United States Patent [19]

Voorman

[11] Patent Number: 5,063,356

[45] Date of Patent: Nov. 5, 1991

[54] BALANCED FILTER CIRCUIT HAVING A CONTROLLABLE BALANCED CURRENT MULTIPLIER

[75] Inventor: Johannes O. Voorman, Eindhoven, Netherlands

[73] Assignee: U.S. Philips Corporation, New York, N.Y.

[21] Appl. No.: 585,341

[22] Filed: Sep. 19, 1990

[30] Foreign Application Priority Data

Sep. 29, 1989 [NL] Netherlands ............ 8902420

[51] Int. Cl.[5] ............................................. H03F 3/191
[52] U.S. Cl. ..................................... 330/306; 330/107
[58] Field of Search ............... 330/107, 302, 303, 304, 330/305, 306, 310

[56] References Cited

U.S. PATENT DOCUMENTS

4,509,019 4/1985 Banu et al. ................. 330/305 X
4,780,690 10/1988 Voorman ................. 330/303 X

*Primary Examiner*—Steven Mottola
*Attorney, Agent, or Firm*—Bernard Franzblau

[57] ABSTRACT

A balanced filter circuit has a number of balanced push-pull amplifiers (10) whose inputs (11, 12) and outputs (13, 14) are coupled to filter resistors (20, 21, 22, 25, 27A/B) and filter capacitors (23, 24, 26A/B). In order to adjust the filter, the currents from the filter resistors to the inputs of the balanced amplifiers are varied by means of adjustable balanced multipliers (40).

13 Claims, 5 Drawing Sheets

BALANCED FILTER CIRCUIT HAVING A CONTROLLABLE BALANCED CURRENT MULTIPLIER

BACKGROUND OF THE INVENTION

This invention relates to a balanced filter circuit comprising filter inputs for supplying an input signal and filter outputs for deriving an output signal, the filter circuit comprising
    a balanced amplifier having an inverting input and a non-inverting input which are coupled to the filter inputs, and an inverting output and a non-inverting output which are coupled to the filter outputs; and
    at least one pair of filter resistors comprising a first and a second filter resistor.

Such a filter circuit is known from U.S. Pat. No. 4,509,019. The filter circuits shown therein are composed of a number of balanced amplifiers with filter resistors and filter capacitors connected pairwise thereto. In order to be able to tune the filter, in the known filter circuit all of the filter resistors are in the form of MOS transistors, whose resistance is adjusted by a variable voltage at the control electrodes of the MOS transistors. This method allows only a comparatively small variation of the filter resistances so that only a limited tuning range of the filter is obtained. An alternative method is known from European Patent Application 0 270 156, which corresponds to U.S. Pat. No. 4,780,690. In this case, the filter resistors are in the form of a transconductance circuit, whose transconductance is adjusted by an adjustable current source. The transconductance circuit behaves like a pair of filter resistors whose value is inversely proportional to the transconductance. The transconductance and hence the resistance value of such a transconductance circuit can be controlled over a comparatively wide range. Since for each pair of resistors a transconductance circuit with an adjustable current source is required, with more complex filter circuits the number of electronic components for the transconductance circuits and hence the current consumption related to these circuits increase.

SUMMARY OF THE INVENTION

The invention has, inter alia, for an object to provide a balanced filter circuit having a comparatively wide control range, which has a simple construction and a comparatively low current consumption.

A balanced filter circuit of the kind mentioned in the opening paragraph is for this purpose characterized according to the invention in that the balanced filter circuit further comprises a controllable balanced current multiplier, of which a first and a second current input are connected to the first and the second filter resistor and of which a first and a second current output are connected to the inverting input and the noninverting input.

By means of the balanced current multiplier, the currents flowing through the filter resistors of the pair of filter resistors can be multiplied by an adjustable factor before these currents are supplied to the inputs of the balanced amplifier. The effect on the filter circuit is equivalent to that of a variable resistor or of a variable transconductance circuit. If now a group of pairs of filter resistors is coupled to the inputs of one balanced amplifier, the overall current to the input can be varied by means of only one balanced current multiplier. All filter resistors of the group can thus be adjusted by one adjustment member. As a result, the number of components considerably decreases, which results in a reduction of the whole current consumption.

A first embodiment of a balanced filter circuit according to the invention is characterized in that the balanced current multiplier comprises a differential pair including a first and a second transistor of a first conductivity type, whose collectors are coupled to the first and the second current output, whose emitters are coupled to a first current source and whose bases are coupled to the first and the second current input, and which are further coupled through a first and a second semiconductor junction to a second current source, while at least one of the first and the second current sources is adjustable.

Such a circuit is known per se from B. Gilbert, "A new Wide-Band Amplifier Technique", I.E.E.E. Journal of Solid State Circuits, Vol. SC-3, p. 353–365, December 1968. The first and the second transistor and the first and the second semiconductor junction constitute a so-called translinear loop. It can be shown by the known exponential relation between the current through a semiconductor junction and the voltage across it that the currents through the first and the second transistor and the currents through the first and the second semiconductor junction are in the same mutual proportion as the currents through the first and the second current source. The current amplification of the balanced current multiplier can be varied in that the first and/or the second current source are made adjustable.

A second embodiment of a balanced filter circuit according to the invention is characterized in that the inverting output and the non-inverting output of the balanced amplifier are coupled to a first and a second filter resistor, respectively, of a further pair of filter resistors via buffer stages, which derive a bias current via the first and the second filter resistor, respectively, of the further pair of filter resistors.

The inverting and non-inverting outputs of the balanced amplifier are connected to pairs of filter resistors and filter capacitors. The signal currents through these pairs are supplied by the balanced amplifier via buffer stages having a low output impedance.

When the bias currents of the buffer stages are caused to flow through the connected filter resistors, then the bias current of the second current source of the balanced current multiplier connected to the filter resistors serves at the same time as a bias current for the buffers. Thus, the current consumption is reduced. Since no separate bias current supply for the buffer stages is required, components are also saved. This bias current supply is also possible with filter resistors which are connected as negative feedback resistors. For this purpose, a third embodiment of a balanced filter circuit can be characterized in that the inverting and non-inverting outputs of the balanced amplifier are coupled to the first and the second filter resistor via buffer stages, which derive a bias current via the second and the first filter resistor, respectively.

A fourth embodiment according to the invention is characterized in that a load circuit is arranged between the first and the second current output of the balanced current multiplier. The load circuit is provided with two current source transistors of a second conductivity type opposite to the first conductivity type, whose emitters are connected to a supply terminal, whose collectors are connected to the collectors of the first and the second transistor of the differential pair and whose bases are connected via a semiconductor junction to the emitter of a control transistor of the second conductivity type, whose base is connected to the junction point of a first and a second load resistor, which are coupled to the first and the second current output, respectively.

In such an embodiment, a wide modulation range of the filter circuit is obtained.

The load circuit suppresses the common mode component in the output currents of the balanced current multiplier, as a result of which a wider modulation range is left for the differential-mode component. It should be noted that a similar load circuit is known per se from the aforementioned European Patent Application 0 270 156, but not in combination with a balanced current multiplier.

A fifth embodiment of a balanced filter circuit according to the invention is characterized in that the balanced amplifier is provided with a differential pair comprising two transistors of the first conductivity type, whose collectors are connected to the inverting output and the non-inverting output and whose bases are connected to the non-inverting input and the inverting input, and in that the first and the second current output of the balanced current multiplier are coupled via a first and a second voltage follower transistor of the first conductivity type to the inverting input and the non-inverting input of the balanced amplifier.

The first and the second voltage follower transistors ensure a drive with low output impedance for the two transistors of the differential pair of the balanced amplifier. As a result, a simple construction of the balanced amplifier is possible. The accuracy of the filter is increased since the voltage follower transistors provide an effective separation between the current supply to the first and to the second current output of the balanced current multiplier on the one hand, and to the inverting and non-inverting input of the balanced amplifier on the other hand.

BRIEF DESCRIPTION OF THE DRAWINGS

The invention will be described more fully with reference to the accompanying drawing, in which.

DESCRIPTION OF THE PREFERRED EMBODIMENTS

Figure 1:
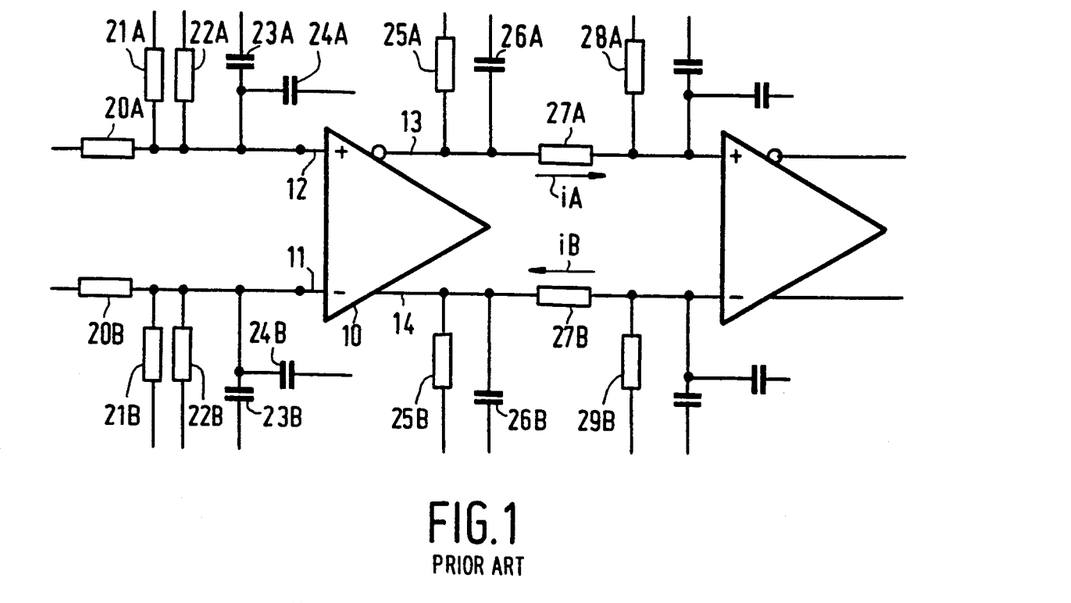
FIG. 1 shows the general construction of a balanced filter circuit.

FIG. 1 shows a detail of a balanced filter circuit. The filter is composed of one or more balanced amplifiers 10 which are provided with an inverting input 11, a non-inverting input 12, an inverting output 13 and a non-inverting output 14. The inputs and outputs are balanced, which means that the signals prevailing there are substantially of equal amplitude and in phase opposition. The amplifiers are embedded in a plurality of pairs of equal filter resistors and filter capacitors, which are connected to the inputs and the outputs of the amplifiers and which determine the filter transmission characteristic of the filter circuit. By way of example, the pairs of filter resistors 20A/20B, 21A/21B, 22A/22B and the pairs of capacitors 23A/23B, 24A/24B are connected to the non-inverting input 12 and the inverting input 11 of the amplifier 10. These pairs are in turn connected to outputs of other balanced amplifiers (not shown) or to the outputs of the same balanced amplifier or to the input terminals (not shown) of the filter circuit for the supply of a signal to be filtered. By way of example, the pairs of filter resistors 25A/25B, 27A/27B and the filter capacitors 26A/26B are connected likewise to the inverting output 13 and the non-inverting output 14 of the balanced amplifier 10. The pair of resistors 27A/27B is connected here to the inputs of a second balanced amplifier, while the pair of resistors 25A/25B and the pair of capacitors 26A/26B are connected to the inputs of further balanced amplifiers (not shown). In one of the amplifiers the outputs are connected to output terminals (not shown) for deriving the filtered signal. The manner in which the resistors and capacitors are provided determines the filter function of the filter circuit. Many variations and combinations are possible and are described in U.S. Pat. No. 4,509,019. All filter elements, resistors and capacitors, are traversed by signal currents which are in phase opposition per pair of elements. In FIG. 1 this is indicated by iA/iB for the pair of resistors 27A/27B. The filter circuits have in common that all filter elements are connected between an output of a balanced amplifier or one of the input terminals of the filter circuit and one of the inputs of the same or another balanced amplifier, which behaves like a virtual ground point, which itself substantially does not draw any current.

Figure 2A:
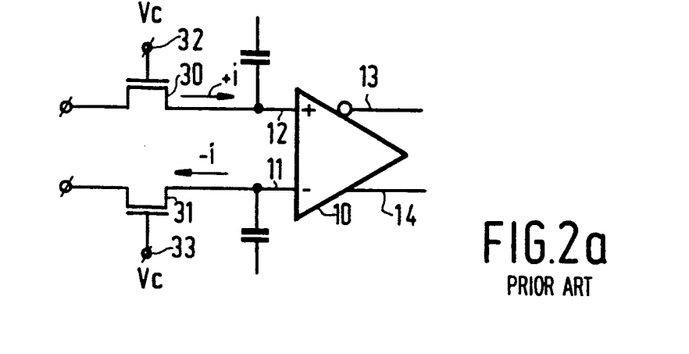
FIGS. 2a and 2b show known solutions for variable filter resistors in balanced filter circuits.
Figure 2B:
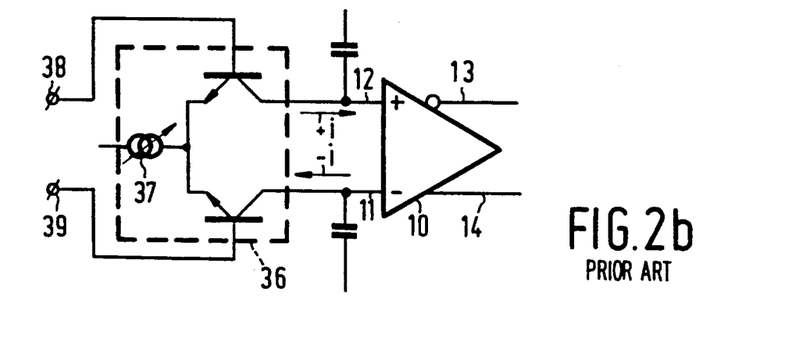

In order to make it possible to adjust the tuning frequency of such a balanced filter circuit, all of the resistors are made to be adjustable. FIG. 2 shows two known embodiments of adjustable resistors. In FIG. 2a, the resistors are replaced by MOS transistors 30, 31, whose forward resistance is adjustable by a control voltage Vc at the control electrodes 32, 33 of the respective MOS transistors. This embodiment, which is known from U.S. Pat. No. 4,509,019, has the disadvantage that the range in which the resistance of the MOS transistor is adjustable is rather limited. FIG. 2b shows a circuit in which the pair of filter resistors is replaced by a transconductance circuit 36 having a transconductance which is adjustable by a current source 37. The transconductance circuit 36 converts the balanced signal voltage at the terminals 38, 39 into two balanced signal currents $+i$, $-i$, which flow to the inputs 12, 11 of the connected balanced amplifier 10. The circuit shown in FIG. 2b, which is known from EP 0 270 156, has a wider usable adjustment range, but requires per pair of filter resistors a transconductance circuit with an adjustable current source. In a filter circuit as shown in FIG. 1, for the pairs of resistors 20A/20B, 21A/21B and 22A/22B three such transconductance circuits each with an adjustable current source would be required. In slightly more complex balanced filter circuits, the number of components and the current consumption associated therewith rapidly increase.

Figure 3:
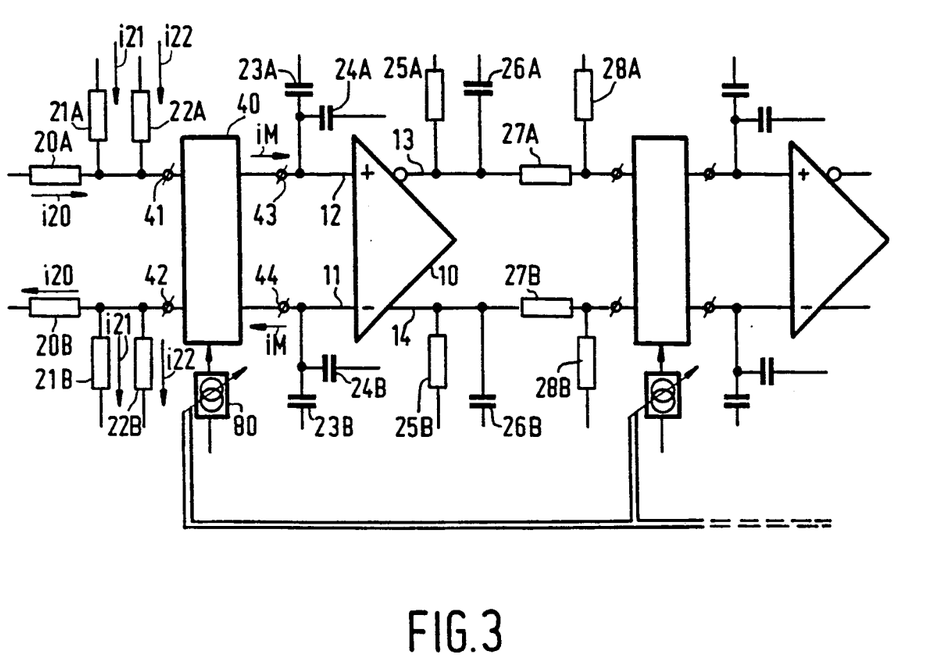
FIG. 3 shows an embodiment of a balanced filter circuit according to the invention.

A solution according to the invention is shown in FIG. 3, in which corresponding parts have the same reference numerals as in FIG. 1. The pairs of resistors 20A/20B, 21A/21B and 22A/22B are connected here to the balanced current inputs 41, 42 of the balanced current multiplier 40, whose balanced current outputs 43, 44 are connected to the inputs 12, 11 of the balanced amplifier 10. The pairs of capacitors 23A/23B and 24A/24B are connected, as in FIG. 1, directly to the inputs 12, 11 of the amplifier 10. The current multiplier multiplies the overall balanced input current i20+i21+i22 due to the contributions i20, i21, and i22 of the pairs of resistors 20A/20B, 21A/21B and 22A/22B, respectively, by a factor which is adjustable by the adjustment member 80. The resulting balanced output currents +iM and −iM at the current outputs 43 and 44 flow to junction points to which the inputs 12, 11 of the balanced amplifier 10 are connected. In the balanced filter circuit shown in FIG. 3, it is not the filter resistors themselves which are adjusted, but the currents flowing from these resistors to the junction points to which the inputs of the balanced amplifier are connected the are adjusted. When these currents are collected at the current inputs of the current multiplier, the overall contribution of the connected pairs of filter resistors now can be adjusted by only one adjustable multiplier. In a complex balanced filter circuit, this results in a considerable saving of components and current consumption. When all the relevant control members are operated simultaneously, the tuning frequency of the whole filter circuit can be adjusted.

Figure 4:
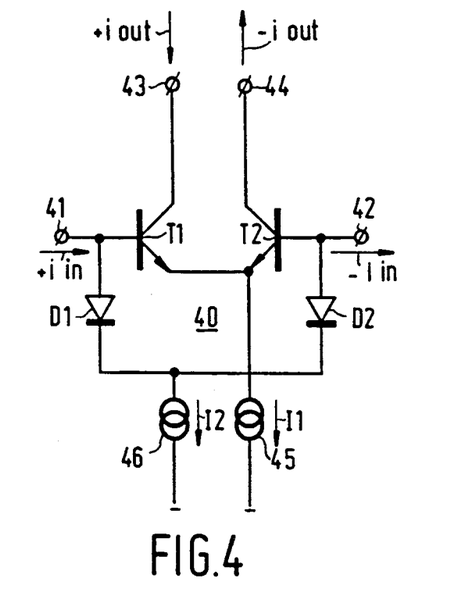
FIG. 4 shows an embodiment of a balanced current multiplier.

FIG. 4 shows an embodiment of a balanced current multiplier. In this Figure, corresponding parts are designated by the same reference symbols as in FIG. 1. The two npn transistors T1 and T2 are connected as a differential pair, with the emitters connected to a first bias current source 45, which supplies a bias current I1. The bases of transistors T1 and T2 are connected to the current inputs 41 and 42, respectively, and the collectors are connected to the current outputs 43 and 44, respectively. A second bias current source 46, which supplies a bias current I2, is connected via semiconductor junctions D1 and D2, respectively, to the current inputs 41 and 42, respectively. Instead of semiconductor junctions, npn transistors connected as diodes may also be used. The baseemitter junctions of the transistors T1 and T2 and the semiconductor junctions D1 and D2 constitute a translinear loop. It can be shown by the known exponential relation between the current through a semiconductor junction and the voltage across it that the signal current amplification iout-iin between the current output 43 and 44, respectively, and the current input 41 and 42, respectively, is equal to the ratio I1/I2 of the bias current sources 45 and 46. When the first or the second bias current source are made adjustable, the current amplification of the balanced current multiplier 40 can be adjusted. The relevant current source then acts as the adjustment member 80 of FIG. 3.

Figure 5:
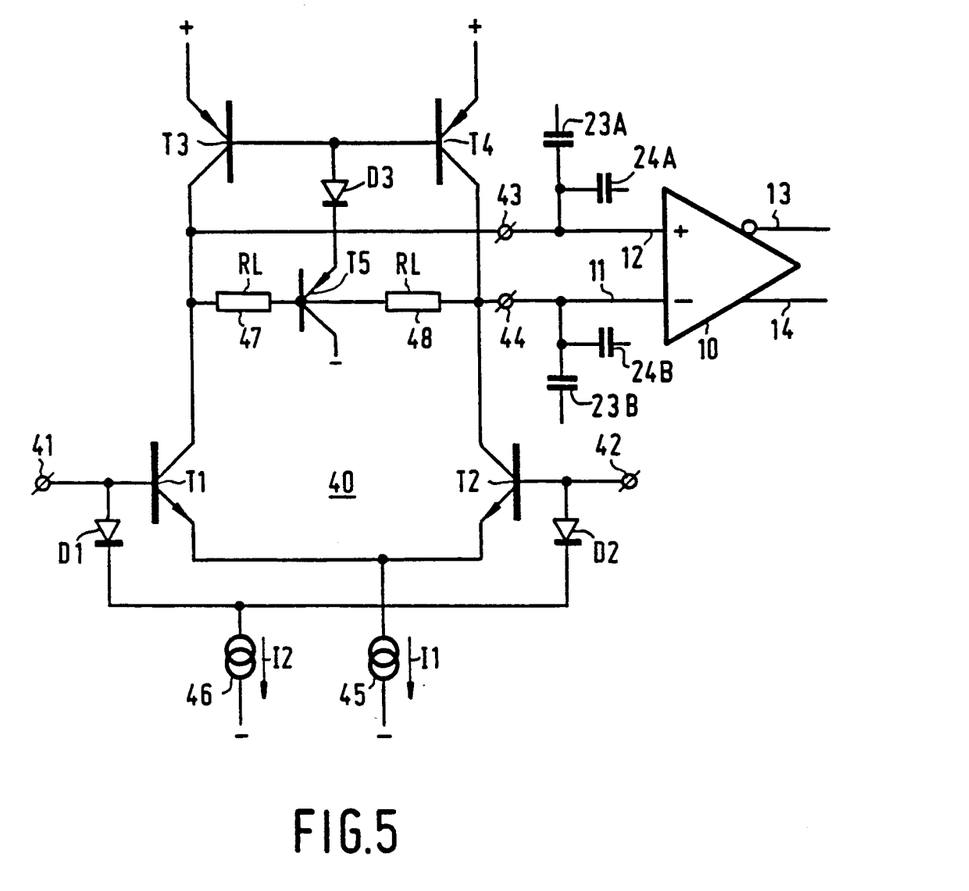
FIG. 5 shows an embodiment of a balanced current multiplier for use in a balanced filter circuit according to the invention.

FIG. 5 shows the circuit diagram of a balanced current multiplier 40 provided with a load circuit. In this Figure, corresponding parts are designated by the same reference numerals as in FIGS. 3 and 4. PNP current source transistors T3 and T4 are connected in series with the collectors of the transistors T1 and T2, the collectors of the transistors T1 and T3 and those of T2 and T4 being connected to each other. The emitters of the transistors T3 and T4 are connected to a positive supply terminal. The load circuit further comprises two equal resistors 47 and 48, which are connected in series across the current outputs 43 and 44. The junction point of these resistors is connected to the base of a pnp transistor T5, whose collector is connected to a negative supply terminal and whose emitter is connected through a diode D3 to the bases of the current source transistors T3 and T4. The transistor T5 holds the junction point of the resistors 47, 48 at a fixed direct voltage, while because of the small base current of the transistor T5 substantially the same direct voltage prevails at the current outputs 43 and 44. Because of the high collector impedance, negligible signal currents flow in the current source transistors T3 and T4. The value of the resistors 47 and 48 is chosen to be large with respect to the resistance value of the load to be connected to the current outputs 43 and 44 so that only a small signal current flows through the resistors 47, 48. The amplifier 40 connected to the current outputs 43 and 44 ensures that by negative feedback a very small signal voltage is obtained across these outputs. The value RL of the resistors 47 and 48 therefore need not be very high to convey already a practically negligibly small current. The load circuit on the one hand ensures an effective common mode suppression of the adjustment currents and adjustment voltages at the current outputs 43 and 44 and on the other hand a high differential mode amplification of the balanced output signals at the current outputs 43 and 44.

As appears from FIGS. 1 and 3, the inverting output 13 and the non-inverting output 14 of the balanced amplifier 10 are loaded with a plurality of network elements. This generally holds for all of the balanced amplifiers present. In order that all of these network elements can be supplied with signal current, these outputs should have a sufficiently low output impedance. This is achieved in that the outputs are provided with buffer stages. These buffer stages may be composed in any suitable manner, but with regard to their direct current biassing they will each separately be provided with bias current sources.

Figure 6:
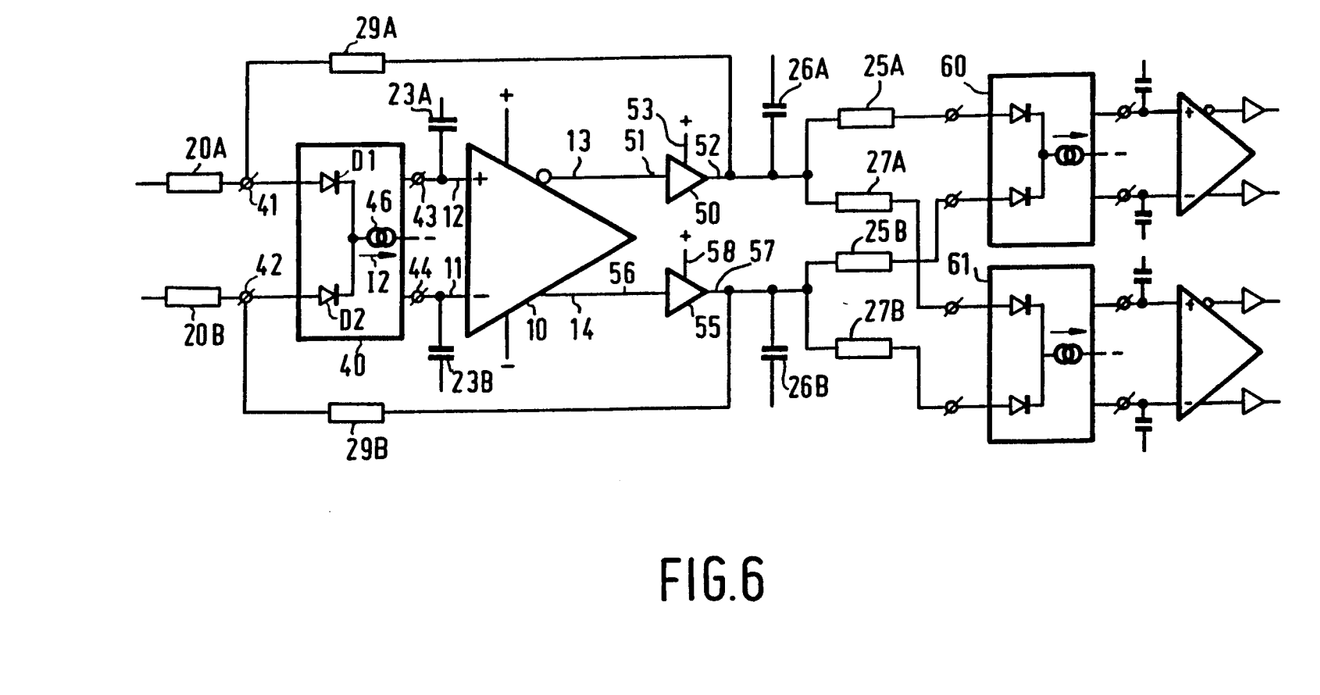
FIG. 6 shows an embodiment of a balanced filter circuit according to the invention.

According to the invention, components and current consumption can advantageously be economized in that the bias current source 46 of the current multipliers is utilized at the same time as a source for the bias current of the buffer stages of the balanced amplifiers. In FIG. 6, in which corresponding parts have the same reference numerals as in the preceding Figures, an example of a balanced filter circuit comprising buffered amplifiers is shown. The inverting output 13 and the non-inverting output 14 of the amplifier 10 are connected to the inputs 51 and 56, respectively, of buffer stages 50 and 55, respectively. The output 52 of the buffer stage 50 is connected to filter resistors 25A, 27A and 29A, which are in turn connected to a current input of current multipliers 60, 61 and 40, respectively. In a corresponding manner, the output 57 of the buffer stage 55 is connected via filter resistors 25B, 27B and 29B to the other current inputs of the current multipliers 60, 61 and 40, respectively. A part of the bias current for the buffer stage 50 flows from its positive supply terminal 53 via the filter resistor 29A and the diode D1 to the bias current source 46 of the current multiplier 40. Other parts of the bias current for the buffer stage 50 flow via the filter resistors 25A and 27A and corresponding diodes of the current multipliers 60 and 61, respectively, to the associated bias current sources. The buffer stage 55 is supplied in a similar manner with bias current.

The buffer stage 50 may be in form of a transistor connected as an emitter follower, whose base, emitter and collector are connected to the input 51, the output 52 and the supply terminal 53, respectively. Instead of emitter followers, more complex circuits are also possible, it not being necessary for the whole bias current flowing at the supply terminal 53 into the buffer stage to flow away via the output terminal 52 and the connected filter resistors to the negative supply. The remaining buffer stages may be constructed in a similar manner as the buffer stage 50.

Figure 7:
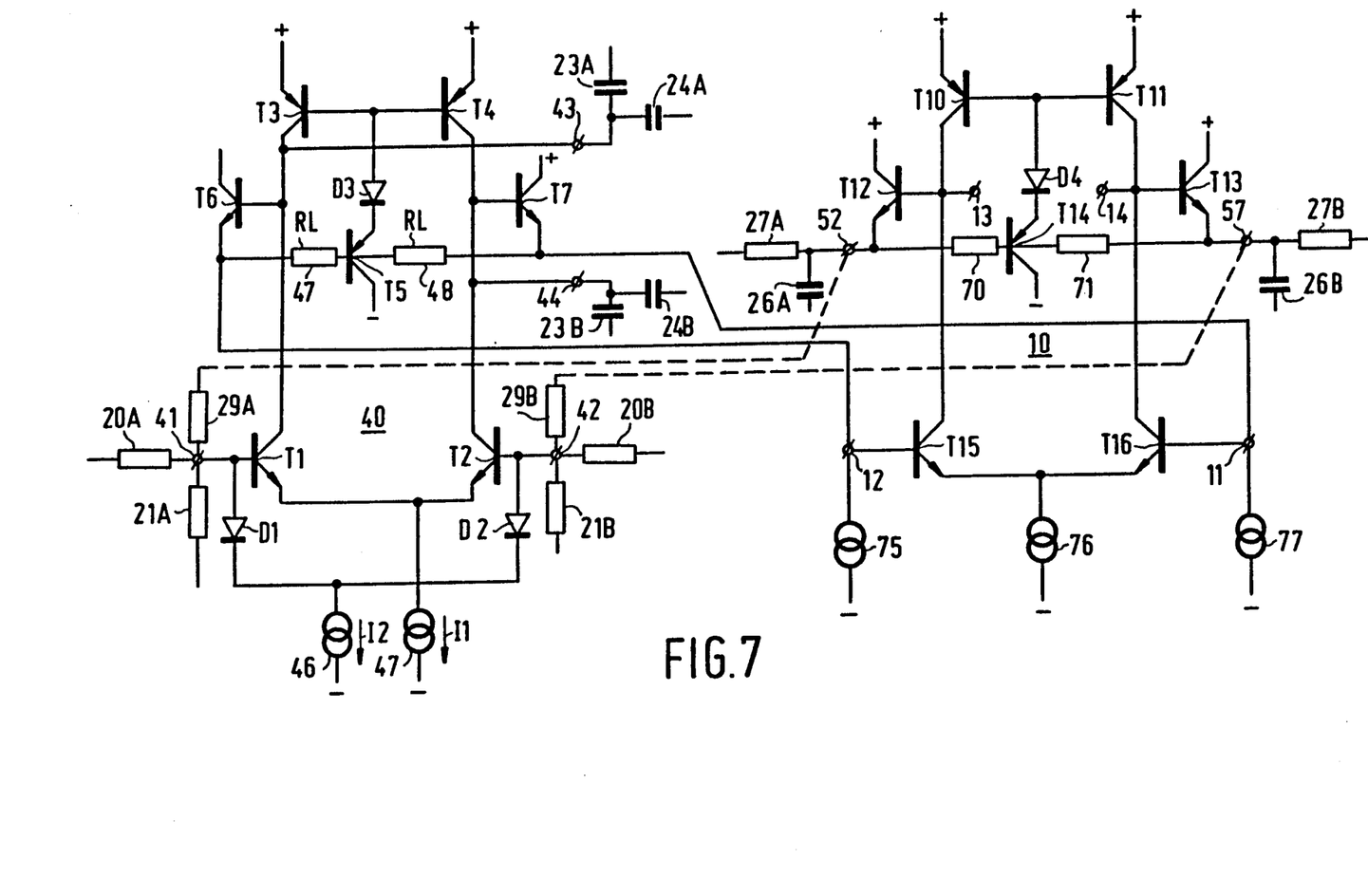
FIG. 7 shows a circuit diagram of a balanced current multiplier and a balanced amplifier for use in a balanced filter circuit according to the invention.

FIG. 7 shows a detailed circuit diagram of an embodiment of a balanced current multiplier 40, which is coupled to the balanced amplifier 10. The parts in FIG. 7 corresponding to those in the preceding Figures have the same reference numerals. The load circuit of the current multiplier 40 is extended with respect to that of FIG. 5 with npn voltage follower transistors T6 and T7, whose bases are connected to current outputs 43 and 44, respectively, and whose collectors are connected to the positive supply terminal. The resistors 47 and 48 in this case are connected not to the current outputs 43 and 44, but to the emitters of the transistors T6 and T7, respectively. The emitter of the transistor T6 is connected to the non-inverting input 12 of the balanced amplifier 10 and is supplied with current by a current source 75. Likewise, the emitter of the transistor T7 is connected to the inverting input 11 and the current source 77. The input stage of the balanced amplifier 10 consists of an npn differential pair T15, T16, whose emitters are connected to the current source 76 and whose bases are connected to the non-inverting input 12 and the inverting input 11, respectively. The combinations T6/T15 and T7/T16 behave with respect to the current outputs 43 and 44 like highohmic impedances, which prevent signal currents from flowing to the inputs 11, 12 of the balanced amplifier 10. In this manner, the signal currents remain within the filter components, as a result of which the accuracy of the whole balanced filter circuit increases.

The balanced amplifier 10 is provided, like the current multiplier 40, with a load circuit comprising the transistors T10, T11, T12, T13, T14, a diode D4 and resistors 70 and 71, which is connected in the same manner to the transistors T15/T16 as are the components T3, T4, T6, T7, T5, D3, 47 and 48 to the transistors T1/T2. The transistors T12 and T13 are connected as voltage followers and act as buffer stages, which can be supplied with adjustment currents via filter resistors in the manner described above, as indicated by the dotted lines.

The invention is not limited to the embodiments shown and described. The balanced current multiplier and the balanced amplifier may be constructed in any suitable manner, equivalent solutions with MOS transistors also being possible. In the embodiment shown with bipolar transistors, npn and pnp transistors may be interchanged, in which event the supply voltages must be inverted in a suitable manner.

I claim:

1. A balanced filter circuit comprising: filter inputs for supplying an input signal and filter outputs for deriving an output signal,
    a balanced amplifier having an inverting input and a non-inverting input coupled to the filter inputs, and an inverting output and a non-inverting output coupled to the filter outputs;
    at least one pair of filter resistors comprising a first and a second filter resistor, and
    a controllable balanced current multiplier having a first and a second current input connected to the first and the second filter resistor and a first and a second current output connected to the inverting input and the non-inverting input of the balanced amplifier.

2. A balanced filter circuit as claimed in claim 1, wherein the balanced current multiplier comprises a differential pair including a first and a second transistor of a first conductivity type, whose collectors are coupled to the first and the second current output, whose emitters are coupled to a first current source and whose bases are coupled to the first and the second current input, which are coupled through a respective first and a second semiconductor junction to a second current source, and wherein at least one of the first and the second current sources is adjustable.

3. A balanced filter circuit as claimed in claim 2, wherein the inverting output and the non-inverting output of the balanced amplifier are coupled to a first and a second filter resistor, respectively, of a further pair of filter resistors via respective buffer stages, and wherein the buffer stages derive a bias current via the first and the second filter resistor, respectively, of the further pair of filter resistors.

4. A balanced filter circuit as claimed in claim 2, wherein the inverting output and the non-inverting output of the balanced amplifier are coupled to the second and the first filter resistor via resistor buffer stages, and wherein the buffer stages derive a bias current via the second and the first filter resistor, respectively.

5. A balanced filter circuit as claimed in claims 2, 3, or 4, further comprising a load circuit coupled between the first and the second current output of the balanced current multiplier, said load circuit comprising two current source transistors of a second conductivity type opposite to the first conductivity type, whose emitters are connected to a supply terminal, whose collectors are connected to the collectors of the first and the second transistor of the differential pair and whose bases are connected via a semiconductor junction to the emitter of a control transistor of the second conductivity type, means connecting a base of the control transistor to a junction point of a first and a second load resistor, which first and second load resistors are coupled to the first and second current output, respectively.

6. A balanced filter circuit as claimed in claim 5, wherein the balanced amplifier comprises a differential pair including two transistors of the first conductivity type, whose collectors are connected to the inverting output and the non-inverting output and whose bases are connected to the non-inverting input and the inverting input, and means coupling the first and the second current output of the balanced current multiplier via a respective first and a second voltage follower transistor of the first conductivity type to the inverting input and the non-inverting input of the balanced amplifier.

7. A balanced filter circuit as claimed in claim 6, wherein the inverting output and the non-inverting output of the balanced amplifier are coupled to bases of a third and a fourth voltage follower transistor of the first conductivity type, between whose emitters a series-combination of two load resistors is connected, means connecting a junction point of said two load resistors to a base of a control transistor of the second conductivity type, whose emitter is connected through a semiconductor junction to bases of two current source transistors of the second conductivity type, whose collectors are connected to the inverting output and the non-inverting output and whose emitters are connected to the supply terminal.

8. A balanced filter circuit as claimed in claim 1, wherein the inverting output and the non-inverting output of the balanced amplifier are coupled to a first and a second filter resistor, respectively, of a further pair of filter resistors via respective buffer stages, and wherein the buffer stages derive a bias current via the first and the second filter resistor, respectively, of the further pair of filter resistors.

9. A balanced filter circuit as claimed in claim 1, wherein the inverting output and the non-inverting output of the balanced amplifier are coupled to the second and the first filter resistor via respective buffer stages, and wherein the buffer stages derive a bias current via the second and the first filter resistor, respectively.

10. A balanced filter circuit which includes capacitance means and resistance means, said filter circuit comprising:
    first and second signal input terminals,
    first and second signal output terminals,
    a balanced amplifier having an inverting input and a non-inverting input and furthermore an inverting output and a non-inverting output coupled to said first and second output terminals, respectively,
    wherein said resistance means includes at least one pair of first and second filter resistors,
    a controllable balanced current multiplier having first and second current inputs coupled to said first and second filter resistors and to said first and second signal input terminals, respectively, and
    means coupling first and second current outputs of said balanced current multiplier to the inverting input and the non-inverting input, respectively, of the balanced amplifier.

11. A balanced filter circuit as claimed in claim 10 wherein said balanced current multiplier includes an adjustable current source for adjusting currents from the filter resistors to the inputs of the balanced amplifier thereby to adjust the filter circuit characteristics.

12. A balanced filter circuit as claimed in claim 10 further comprising:
    a first feedback circuit coupled between the inverting output of the balanced amplifier and the first current input of the current multiplier and
    a second feedback circuit coupled between the non-inverting output of the balanced amplifier and the second current input of the current multiplier.

13. A balanced filter circuit as claimed in claim 11 wherein said resistance means comprises at least one further pair of third and fourth filter resistors coupled to said first and second current inputs of the current multiplier whereby said adjustable current source also adjusts currents from the third and fourth filter resistors to the inputs of the balanced amplifier.

* * * * *